(12) United States Patent
Lu

(10) Patent No.: US 11,393,391 B2
(45) Date of Patent: Jul. 19, 2022

(54) DRIVE CONTROL CIRCUIT, DRIVE CONTROL CHIP, INTEGRATED PACKAGED DEVICE, DISPLAY SYSTEM, AND SPARSE DRIVE METHOD

(71) Applicant: FAITH BILLION TECHNOLOGY DEVELOPMENT LIMITED, Wanchai (HK)

(72) Inventor: Zengxiang Lu, Hong Kong (HK)

(73) Assignee: Faith Billion Technology Development Limited, Wanchai (HK)

( * ) Notice: Subject to any disclaimer, the term of this patent is extended or adjusted under 35 U.S.C. 154(b) by 0 days.

(21) Appl. No.: 17/429,554

(22) PCT Filed: Sep. 19, 2019

(86) PCT No.: PCT/CN2019/106704
§ 371 (c)(1),
(2) Date: Aug. 9, 2021

(87) PCT Pub. No.: WO2020/237924
PCT Pub. Date: Dec. 3, 2020

(65) Prior Publication Data
US 2022/0130323 A1    Apr. 28, 2022

(30) Foreign Application Priority Data
May 24, 2019  (CN) .......................... 201910438774.5

(51) Int. Cl.
*G09G 3/32* (2016.01)
*G06F 3/01* (2006.01)
(52) U.S. Cl.
CPC ............... *G09G 3/32* (2013.01); *G06F 3/013* (2013.01); *G09G 2310/0275* (2013.01); *G09G 2310/0291* (2013.01); *G09G 2310/08* (2013.01)

(58) Field of Classification Search
CPC ............. G09G 3/32; G09G 2310/0275; G09G 2310/0291; G09G 2310/08; G06F 3/013
See application file for complete search history.

(56) References Cited

U.S. PATENT DOCUMENTS

| 5,923,825 A | 7/1999 | Orlicki et al. |
| 2005/0035981 A1* | 2/2005 | Ozaki .................... G09G 5/399 345/690 |

(Continued)

FOREIGN PATENT DOCUMENTS

| CN | 1636238 A | 7/2005 |
| CN | 1860520 A | 11/2006 |

(Continued)

OTHER PUBLICATIONS

China Intellectual Property Office, Office Action dated Jan. 27, 2021, in CN 201910438774.5.

(Continued)

*Primary Examiner* — Andrew Sasinowski
(74) *Attorney, Agent, or Firm* — Faegre Drinker Biddle & Reath LLP

(57) ABSTRACT

The present disclosure describes a drive control circuit, a drive control chip, an integrated packaged device, a display system, and a sparse drive method. The drive control circuit includes a data input end, a clock input end, a decoding and control unit, a decoding and gating unit, at least two drive sources, and at least two drive signal output ends. A first input end of the decoding and control unit is electrically connected to the data input end, a second input end is electrically connected to the clock input end, a control input end is electrically connected to a control output end, an address input end is electrically connected to an address output end.

15 Claims, 8 Drawing Sheets

(56) References Cited

U.S. PATENT DOCUMENTS

| | | | |
|---|---|---|---|
| 2009/0121988 A1* | 5/2009 | Amo | G09G 3/32 |
| | | | 345/82 |
| 2009/0179923 A1* | 7/2009 | Amundson | G09G 3/2018 |
| | | | 345/690 |
| 2012/0287173 A1 | 11/2012 | Guttag et al. | |
| 2017/0039959 A1* | 2/2017 | Mallinson | G06F 3/0325 |
| 2018/0075311 A1 | 3/2018 | Weimer et al. | |
| 2019/0094981 A1* | 3/2019 | Bradski | G06F 3/017 |

FOREIGN PATENT DOCUMENTS

| | | |
|---|---|---|
| CN | 1963906 A | 5/2007 |
| CN | 102682682 A | 9/2012 |
| CN | 102708803 A | 10/2012 |
| CN | 202976775 U | 6/2013 |
| CN | 202976776 U | 6/2013 |
| CN | 103617787 A | 3/2014 |
| CN | 107038994 A | 8/2017 |

OTHER PUBLICATIONS

Patent Cooperative Treaty, International Search Report and Written Opinion, dated Feb. 6, 2020, in PCT/CN2019/106704.

* cited by examiner

A drive control circuit drives, according to preset information, M1 drive signal output ends to output drive signals, to control M1 corresponding light-emitting structures to emit light ~ 71

Drive Control Circuit, Drive Control Chip, Integrated Packaged Device, Display System, and Sparse Drive Method The present disclosure is a national phase application under 35 U.S.C. § 371 of PCT Application No. PCT/CN2019/106704, filed Sep. 19, 2019, which claims priority to Chinese Patent Application No. 201910438774.5, filed with the China National Intellectual Property Administration on May 24, 2019, both of the above applications are incorporated herein by reference in their entirety.

TECHNICAL FIELD

Embodiments of the present disclosure relate to drive control technology, for example, to a drive control circuit, a drive control chip, an integrated packaged device, a display system, and a sparse drive method.

BACKGROUND

Light-field display technologies and dense display devices are being increasingly applied. However, because light-field display technologies have relatively high requirements on refresh frame rates the ability to drive a dense display device to form light-field displays is also increasingly being valued.

Conventional drive modes include, for example, a passive addressing drive mode, an active addressing drive mode, a dynamic scanning drive mode, and the like, which all have relatively low refresh frame rates. For example, the refresh frame rates for the passive addressing drive mode and the active addressing drive mode generally range from 60 Hz to 120 Hz, and the refresh frame rate for the dynamic scanning drive mode may reach 3.8 KHz. However, in some cases, light-field display technologies require refresh frame rates on a kilohertz level. For example, when a dot pitch of display pixels is 0.7 mm, and a scan speed is 20 m/s, a refresh frame rate needs to reach 30 KHz. As such, conventional drive modes are far from meeting the requirements of light-field display technologies. Although a static scanning drive mode can meet the requirements of light-field display technologies, the static scanning drive mode requires an excessively large drive chip, has difficulty in wiring, and greatly increases costs.

SUMMARY

The present disclosure provides a drive control circuit, a drive control chip, an integrated packaged device, and a display system, to achieve high frame rates required by light-field display technologies and result in low costs.

According to a first aspect, embodiments of the present disclosure provide a drive control circuit including a data input end, a clock input end, a decoding and control unit, a decoding and gating unit, at least two drive sources, and at least two drive signal output ends. The decoding and control unit includes a first input end, a second input end, a control output end, and an address output end, where the first input end of the decoding and control unit is electrically connected to the data input end, and the second input end of the decoding and control unit is electrically connected to the clock input end. The decoding and gating unit includes an address input end, a control input end, and at least two output ends, where the control input end of the decoding and gating unit is electrically connected to the control output end, the address input end of the decoding and gating unit is electrically connected to the address output end, and the at least two output ends of the decoding and gating unit are electrically connected to first ends of the at least two drive sources in a one-to-one correspondence. The decoding and gating unit is configured to decode an address of the address input end, and gate the control input end of the decoding and gating unit and any one of the output ends of the decoding and gating unit according to a decoding result. The second ends of the at least two drive sources are electrically connected to the at least two drive signal output ends in a one-to-one correspondence, and each drive source is configured to output a drive signal from a second end of the drive source according to a signal from a first end of the drive source.

According to a second aspect, embodiments of the present disclosure provide a sparse drive method applicable to the drive control circuit according to the first aspect. N1 drive signal output ends of the drive control circuit are electrically connected to N1 light-emitting structures in a one-to-one correspondence. The sparse drive method includes driving, by the drive control circuit according to preset information, M1 drive signal output ends to output drive signals and to control M1 corresponding light-emitting structures to emit light, where $1 \le M1 < N1$, and M1 and N1 are both integers.

According to a third aspect, embodiments of the present disclosure provide a drive control chip including at least two cell blocks, a clock terminal, a data terminal, at least two drive output ends, a decoding and buffer memory, a row gating circuit, a column gating circuit, and a comparison controller. Each cell block includes the drive control circuit according to the first aspect The at least two cell blocks are arranged in M2 rows and N2 columns, where M2 and N2 are both positive integers. A first input end of the decoding and buffer memory is electrically connected to the clock terminal, a second input end of the decoding and buffer memory is electrically connected to the data terminal, a first output end of the decoding and buffer memory is electrically connected to an input end of the row gating circuit, and a second output end of the decoding and buffer memory is electrically connected to an input end of the column gating circuit. M2 output ends of the row gating circuit are correspondingly electrically connected to block selection ends of the M2 columns of drive control circuits. N2 output ends of the column gating circuit are electrically connected to data input ends of the N2 columns of drive control circuits. The clock terminal is electrically connected to a clock input end of the drive control circuit. A first input end of the comparison controller is electrically connected to the clock terminal, a second input end of the comparison controller is electrically connected to the data terminal, and an output end of the comparison controller is electrically connected to control instruction ends of all the drive control circuits. The comparison controller is configured to output a control instruction to all the drive control circuits according to an inputted clock signal and an inputted data signal. Second ends of the at least two drive sources are electrically connected to the at least two drive output ends in a one-to-one correspondence.

According to a fourth aspect, embodiments of the present disclosure provide an integrated packaged device including the drive control chip according to the second aspect, an integrated data input end, an integrated clock input end, a power supply terminal, a ground terminal, and a dense display device. The integrated data input end is electrically connected to the data terminal of the drive control chip. The integrated clock input end is electrically connected to the clock terminal of the drive control chip. The power supply terminal is configured to provide electric energy for the integrated packaged device and the ground terminal is configured for grounding. The dense display device includes at least two light-emitting units, and the drive output ends of the drive control chip are electrically connected to the light-emitting units in a one-to-one correspondence.

According to a fifth aspect, embodiments of the present disclosure provide a display system including at least two integrated packaged devices according to the third aspect, a feedback module, and a processing module. The processing module is electrically connected to integrated data input ends and integrated clock input ends of the at least two integrated packaged devices, and the processing module is electrically connected to the feedback module. The processing module is configured to receive preset information sent by a server. The processing modules is further configured to parse, according to feedback information from the feedback module, the preset information and send the preset information to the integrated packaged device to drive the integrated packaged device for display. The feedback module is configured to track position information of an eye, and feed back the position information of the eye to the processing module.

DETAILED DESCRIPTION

The present disclosure is described in detail below with reference to the accompanying drawings and embodiments. It may be understood that specific embodiments described herein are only used to explain the present disclosure, but not to limit the present disclosure. In addition, it should be noted that, for ease of description, the accompanying drawings only show parts relevant to the present disclosure rather than the entire structure.

Figure 1:
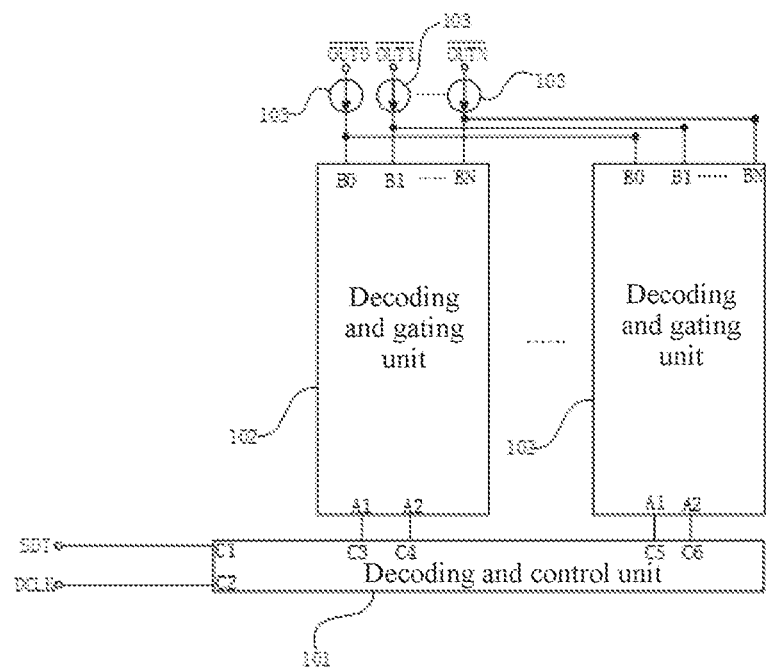
FIG. 1 is a schematic diagram of a circuit structure of a drive control circuit according to an embodiment of the present disclosure.

FIG. 1 is a schematic diagram of a circuit structure of a drive control circuit according to an embodiment of the present disclosure. The drive control circuit includes a data input end SDI, a clock input end DCLK, a decoding and control unit 101, M decoding and gating units 102, N+1 drive sources 103, and N+1 drive signal output ends (OUT0, OUT1, . . . OUTN). For example, M may be an integer ranging from 1 to 4, and N may be an integer ranging from 0 and 111.

The decoding and control unit 101 includes a first input end C1, a second input end C2, control output ends (C3, C5), and address output ends (C4, C6). The control output ends (C3, C5) and the address output ends (C4, C6) are in a one-to-one correspondence. In some embodiments, the first input end C1 of the decoding and control unit 101 is electrically connected to the data input end SDI, and the second input end C2 of the decoding and control unit 101 is electrically connected to the clock input end DCLK.

The decoding and gating units 102 and the control output ends (C3, C5) are in a one-to-one correspondence. Each decoding and gating unit 102 includes an address input end A2, a control input end A1, and at least two output ends (B0, B1, . . . BN). The control input end A1 of the each decoding and gating unit 102 is electrically connected to a corresponding control output end. For example, a control input end A1 of the first decoding and gating unit 102 corresponds to the control output end C3, and a control input end A1 of the $M^{th}$ decoding and gating unit 102 corresponds to the control output end C5. The address input end A2 of the decoding and gating unit 102 is electrically connected to a corresponding address output end. For example, an address input end A2 of the first decoding and gating unit 102 corresponds to the address output end C4, and an address input end A2 of the $M^{th}$ decoding and gating unit 102 is electrically connected to the address output end C6. The N+1 output ends (B0, B1, . . . BN) of the decoding and gating unit 102 are electrically connected to first ends of the N+1 drive sources 103 in a one-to-one correspondence. The decoding and gating unit 102 is configured to decode an address of the address input end A2, and gate the control input end A1 thereof and any one of the output ends according to a decoding result.

Figure 2:
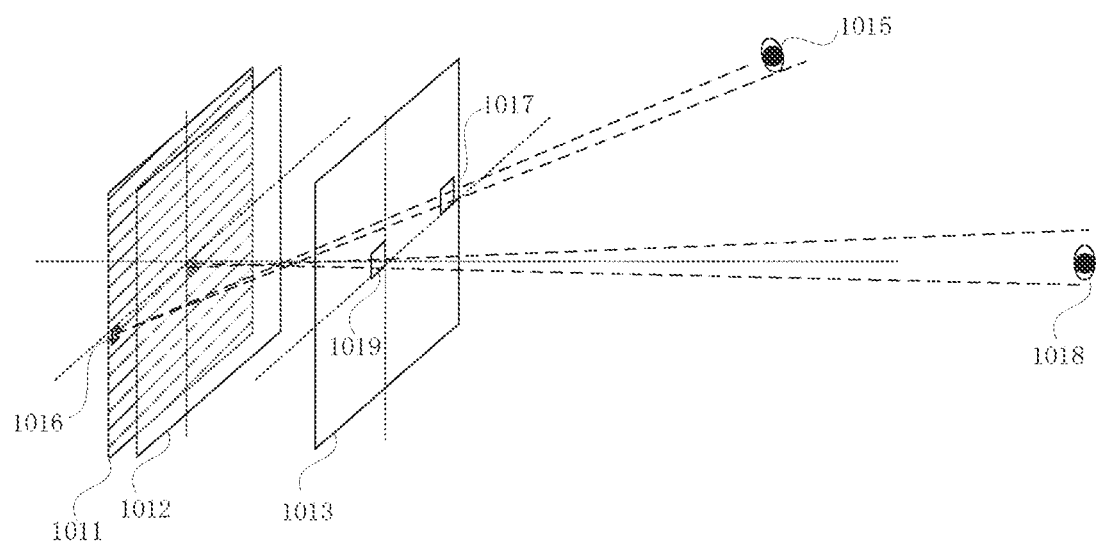
FIG. 2 is a schematic diagram of receiving, by an eye, a vector pixel according to an embodiment of the present disclosure.

FIG. 2 is a schematic diagram of receiving, by an eye, a vector pixel according to an embodiment of the present disclosure. Referring to FIG. 1 and FIG. 2, a dense display device array 1011 may include N+1 micro LEDs 1016. The N+1 micro LEDs 1016 are electrically connected to drive signal output ends in one-to-one correspondence. For example, the N+1 micro LEDs 1016 may be arranged in a format of an array having 14 rows and 8 columns. The dense display device array 1011 and an optical component 1012 may form a vector pixel. A definition for the vector pixel is: (1) a point light source emits narrow light beams relative to a relatively large display scale and the vector pixel can be approximately regarded as a light source emitting light from one point (e.g., an area of the light source is only less than one ten thousandth of an area of a display), where most light beams emitted by the vector pixel into space have a minimum spatial spherical angle that can include all boundaries is less than 10 degrees if a position at which light intensity of a light beam drops to 50% of the maximum intensity of the light beam is used as a boundary of the light beam and a light source is used as a center of a circle; (2) projecting the light beams in (1) in 100 or more distinguishable directions can be supported; (3) the light beams in (1) can be emitted in two or more directions at the same time; and (4) the light beams support at least 16 levels of adjustment in brightness. Light emitted by each micro LED 1016 has a small divergence angle after passing through the optical component 1012, and is displayed on a first display region 1017 of an imaging display surface 1013 (the imaging display surface 1013 may be a virtual display interface). However, display content of the first display region 1017 can only be observed at a viewpoint 1015, and display content of a second display region 1019 of the imaging display surface 1013 can only be observed at a viewpoint 1018. Moreover, limited by a size of a viewing space, a quantity of viewpoints corresponding to each dense display device array 1011 is very small compared to a quantity of micro LEDs 1016 on the dense display device 1011. For example, compared to the micro LEDs 1016 arranged in a form of 14 rows and 8 columns, a maximum quantity of effective viewpoints in an effective viewing region is 4. In this case, only four micro LEDs 1016 need to be driven and a sparse drive method is adopted. A quantity of micro LEDs 1016 corresponding to each viewpoint may not be 1, and in this case, all micro LEDs 1016 corresponding to the each viewpoint need to be driven. In this case, a quantity of micro LEDs 1016 that need to be driven is still relatively small.

The drive source 103 may be a constant current source. Drive signal output ends (OUT0, OUT1, . . . OUTN) of the drive control circuit may be configured to electrically connect the micro LEDs. The clock input end DCLK inputs, under the action of a clock signal, data are inputted by the data input end SDI to the decoding and control unit 101. The decoding and control unit 101 decodes a complete frame of data signals and sends the data to one decoding and gating unit 102 or at least two decoding and gating units 102 according to a decoding result. A quantity of decoding and gating units 102 may be the same as a quantity of viewpoints. A quantity and addresses of decoding and gating units 102 to which the data is transmitted may be determined according to information about a quantity of viewpoints and address information included in the data. For example, an environment to which the drive control circuit is applied includes at most four viewpoints. A quantity of decoding and gating units 102 may be the same as a maximum quantity of viewpoints included in the environment to which the decoding and gating units 102 are applied, where four decoding and gating units 102 are included. If, at a moment, there are only two viewpoints in an environment to which the drive control circuit is applied, the decoding and control unit 101 only needs to send the data to two corresponding decoding and gating units 102. The decoding and gating units 102 decode the received data and gate a control input end and a corresponding output end according to decoding results to drive corresponding micro LEDs to emit light.

According to some embodiments, a drive control circuit includes a data input end, a clock input end, a decoding and control unit, a decoding and gating unit, at least two drive sources, and at least two drive signal output ends is adopted. Data inputted by the data input end SDI is directly inputted to the corresponding decoding and gating unit 102, and the decoding and gating unit 102 is configured to control whether the drive signal output end has output or not. In most cases, the sparse drive method can be adopted as it is unnecessary to drive all drive signal output ends to have outputs. However, a conventional drive circuit needs to use a shift register to send data to all drive signal output ends, where all drive signal output ends have outputs. Therefore, the drive control circuit greatly increases the maximum refresh frame rate at a given bandwidth. For example, when a clock frequency is 80 MHz, and a maximum data amount of a frame of data is 2048 bits, a data frame rate may reach 39.06 kfps, that is, a refresh frame rate may reach 39.06 KHz. In addition, because only micro LEDs corresponding to one or at least two viewpoints need to be driven, the bandwidth required for the work of the drive control circuit is greatly reduced. For example, when the micro LED array includes 200*200 micro LEDs, if the grayscale data required for display is 10 bits, the bandwidth required in a conventional drive mode is 200*200*10 bits*30 KHz=12 Gbps, and the bandwidth amount is huge. However, when the drive control circuit is used, if there are 20 viewpoints (10 viewers), only the bandwidth of 20*10 bits*30 KHz=6 Mbps is needed.

Figure 3:
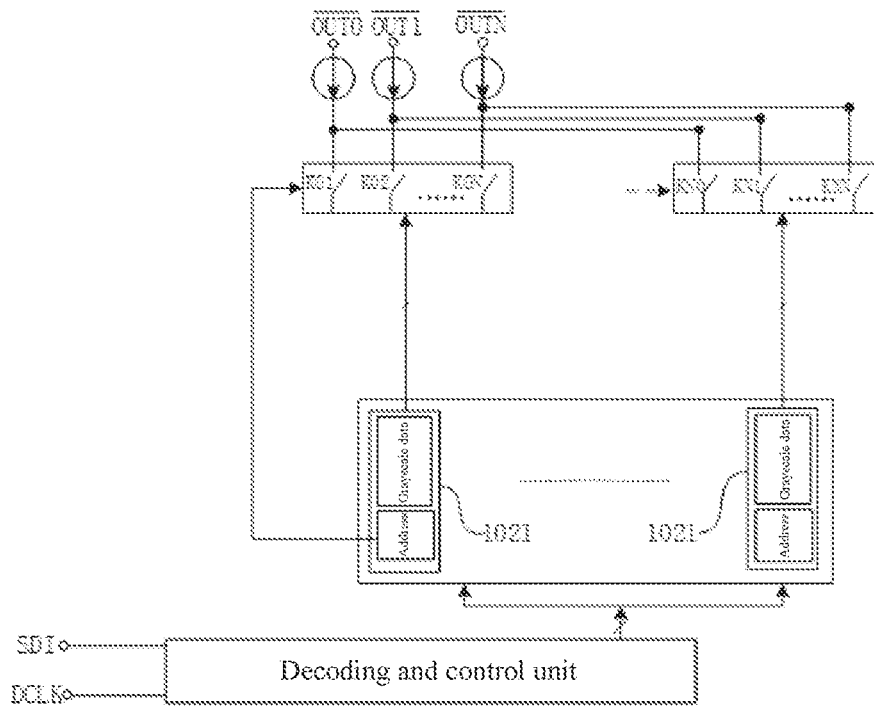
FIG. 3 is a schematic diagram of a circuit structure of another drive control circuit according to an embodiment of the present disclosure.

FIG. 3 is a schematic diagram of a circuit structure of another drive control circuit according to an embodiment of the present disclosure. Referring to FIG. 1 to FIG. 3, a decoding and gating unit includes a decoding buffer memory 1021 and at least two switches.

A first input end of the decoding buffer memory 1021 is electrically connected to the address input end of the decoding and gating unit, a second input end of the decoding buffer memory 1021 is electrically connected to the control input end of the decoding and gating unit, a first output end of the decoding buffer memory 1021 is electrically connected to both or all of control ends of the at least two switches, a second output end of the decoding buffer memory 1021 is electrically connected to both or all of first ends of the at least two switches, and second ends of the at least two switches are electrically connected to the at least two output ends of the decoding and gating unit in a one-to-one correspondence.

If the drive control circuit includes N+1 decoding and gating units, the drive control circuit includes N+1 decoding buffer memories 1021, a first output end of the first decoding buffer memory 1021 is configured to control on or off of a switch K01, a switch K02, . . . , and a switch K0N, a second output end of the first decoding buffer memory 1021 is electrically connected to all of first ends of the switch K01, the switch K02, . . . , and the switch K0N, a first output end of the (N+1)$^{th}$ decoding and gating unit 1021 is electrically connected to all of control ends of a switch KN1, a switch KN2, . . . , and a switch KNN, and a second output end of the (N+1)$^{th}$ decoding and gating unit 1021 is electrically connected to all of first ends of the switch KN1, the switch KN2, . . . , and the switch KNN. The decoding buffer memory 1021 may include a grayscale data image and an address image. For example, after the first decoding buffer memory 1021 decodes received data, the first output end controls on or off of the switch K01, the switch K02, . . . and the switch K0N according to a decoded address. At the same time, the first output end outputs corresponding grayscale data by using corresponding drive signal output ends so as to use the sparse drive method to drive corresponding devices.

According to some embodiments, a decoding and gating unit includes at least two switches and a decoding buffer memory is adopted to control on or off of the at least two switches by using an address image in the decoding buffer memory. The decoding and gating unit further sends corresponding grayscale data to a corresponding drive signal output end to drive corresponding devices, leading to a simple circuit structure and easy configuration.

Figure 4:
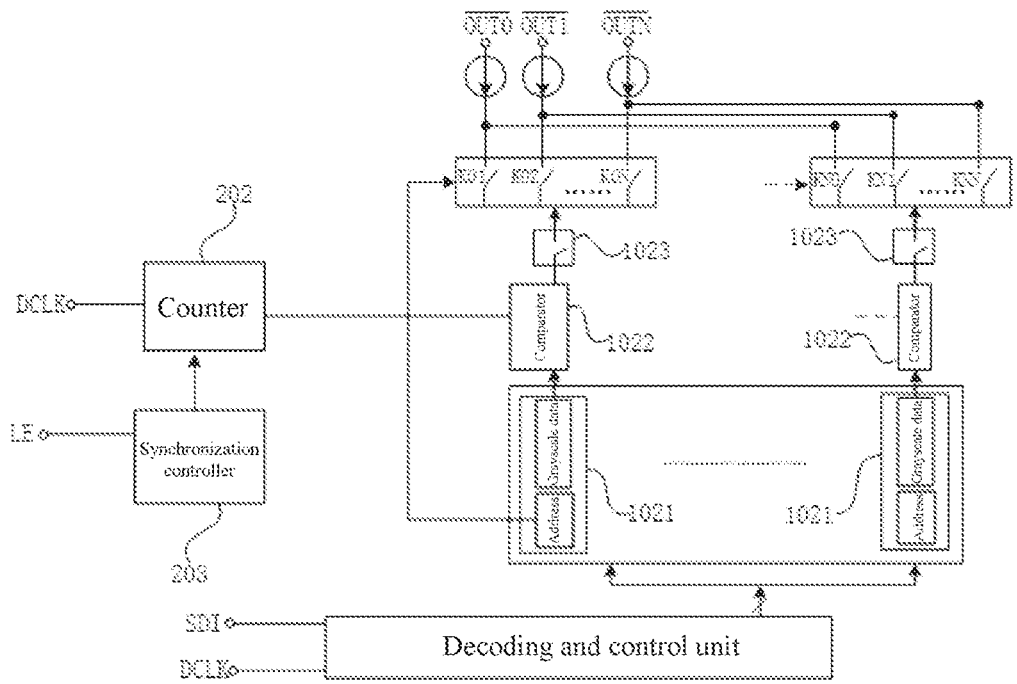
FIG. 4 is a schematic diagram of a circuit structure of still another drive control circuit according to an embodiment of the present disclosure.

FIG. 4 is a schematic diagram of a circuit structure of still another drive control circuit according to an embodiment of the present disclosure. Referring to FIG. 4, the drive control circuit further includes a control instruction end LE, a counter 202, and a synchronization controller 203, where the decoding and gating unit further includes a comparator 1022.

A first input end of the counter 202 is electrically connected to the clock input end DCLK, a second input end of the counter 202 is electrically connected to a first output end of the synchronization controller 203, and an output end of the counter 202 is electrically connected to a first input end of the comparator 1022. A first input end of the synchronization controller 203 is electrically connected to the control instruction end LE. A second input end of the comparator 1022 is electrically connected to the second output end of the decoding buffer memory 1021, and an output end of the comparator 1022 is electrically connected to both or all of first ends of the at least two switches.

For example, the drive control circuit may further include at least two control switches 1023, which are connected into a structure shown in FIG. 4. Another circuit may use the control switches 1023 to control an output state of a drive signal output end of the drive control circuit to improve flexibility of the drive control circuit. A control instruction end LE is configured to input a control instruction in order to control the drive control circuit. After the decoding buffer memory 1021 decodes an address and grayscale data and makes a corresponding switch on, a corresponding drive signal output end starts to output a constant current. If the drive signal output end is electrically connected to a micro LED, the micro LED starts to emit light and the counter 202 starts to count. When a count of the counter 202 reaches a value of corresponding grayscale data, a change of an output state of an output end of the comparator 1022 causes output of the constant current of the corresponding drive signal output end to stop. This implements control of a display time of a micro LED (e.g., duty ratio control) to thereby implement control of the display brightness of the micro LED.

According to some embodiments, a drive control circuit includes a control instruction end, a comparator, a counter, and a synchronization controller is adopted to compare grayscale data in the decoding buffer memory with output of the counter by using the comparator. This implements a duty ratio control of an output signal of a drive signal output end to further implement control of the display brightness of a micro LED so that the micro LED can display more abundant color types.

Figure 5:
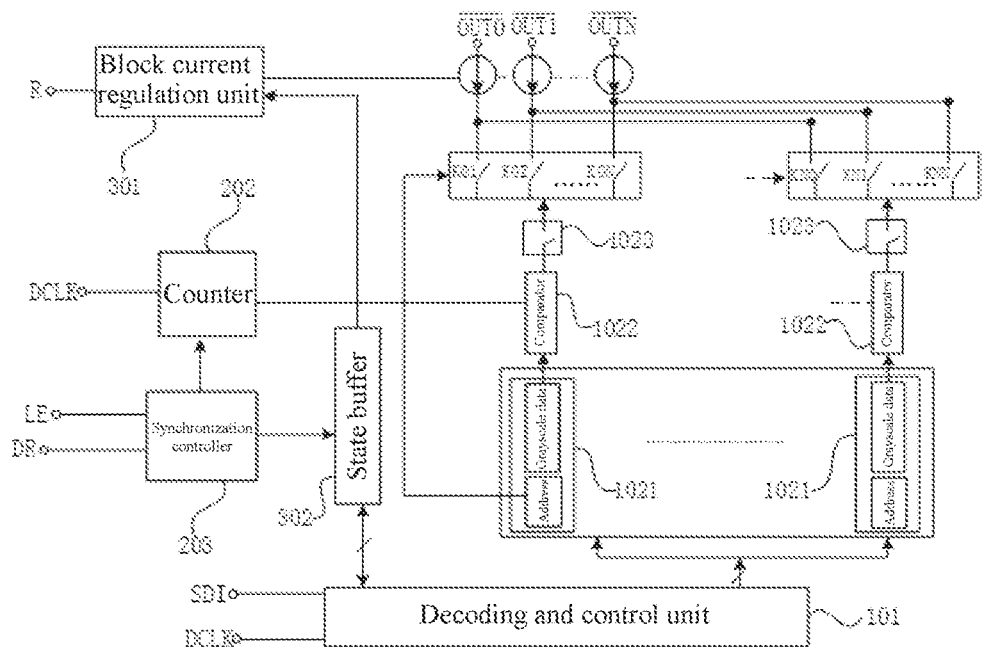
FIG. 5 is a schematic diagram of a circuit structure of yet another drive control circuit according to an embodiment of the present disclosure.

FIG. 5 is a schematic diagram of a circuit structure of still another drive control circuit according to an embodiment of the present disclosure. The drive control circuit further includes a block selection end DR, a block current regulation unit 301, a block current regulation end R, and a state buffer 302.

A first input end of the block current regulation unit 301 is electrically connected to the block current regulation end R, a second input end of the block current regulation unit 301 is electrically connected to a first output end of the state buffer 302, and an output end of the block current regulation unit 301 is electrically connected to both or all of control ends of the at least two drive sources. An input end of the state buffer 302 is electrically connected to a second output end of the synchronization controller 203, and a second output end of the state buffer 302 is electrically connected to a third input end of the decoding and control unit 101. A second input end of the synchronization controller 203 is electrically connected to the block selection end DR. When the block selection end DR inputs a high level, the drive control circuit can work normally. The block current regulation end R is configured to connect a resistor for setting a magnitude of an output signal of a drive source. For example, when the drive source is a constant current source, resistors with different resistances are connected to the block current regulation end R to adjust a value of a current outputted by the constant current source.

Figure 6:
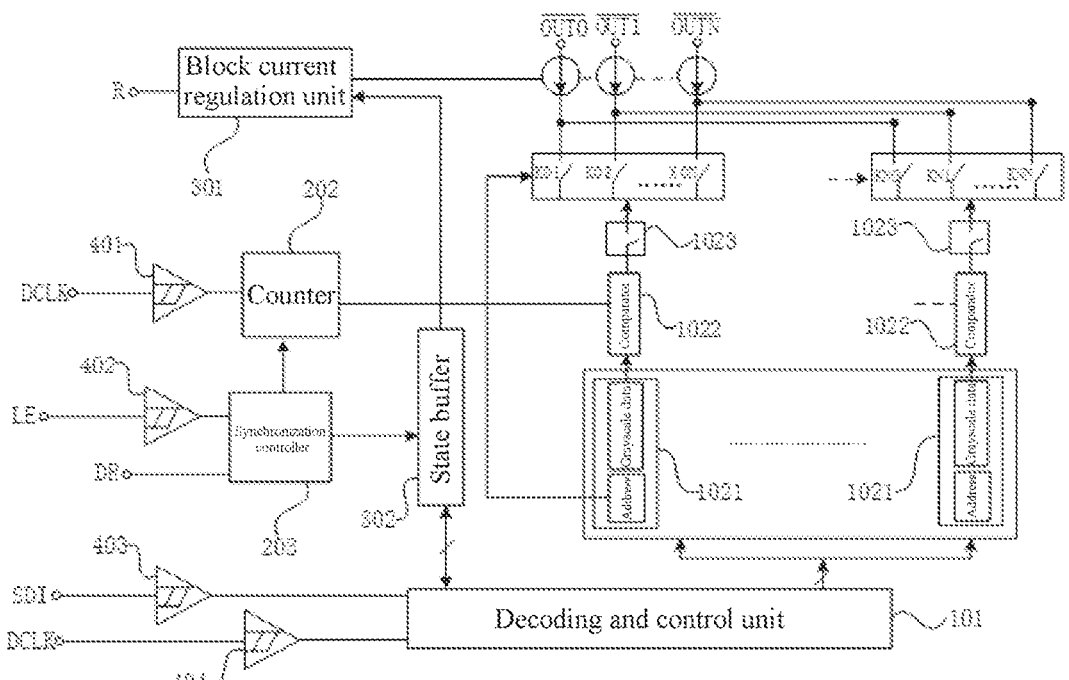
FIG. 6 is a schematic diagram of a circuit structure of a further drive control circuit according to an embodiment of the present disclosure.

FIG. 6 is a schematic diagram of a circuit structure of still another drive control circuit according to an embodiment of the present disclosure. The drive control circuit further includes a first Schmitt trigger 401, a second Schmitt trigger 402, a third Schmitt trigger 403, and a fourth Schmitt trigger 404.

The first input end of the counter 202 is electrically connected to the clock input end DCLK by the first Schmitt trigger 401, where the first input end of the counter 202 is electrically connected to an output end the first Schmitt trigger 401, and the clock input end DCLK is electrically connected to an input end of the first Schmitt trigger 401. A first input end of the synchronization controller 203 is electrically connected to the control instruction end LE by the second Schmitt trigger 402, where the first input end of the synchronization controller 203 is electrically connected to an output end of the second Schmitt trigger 402, and the control instruction end is electrically connected to an input end of the second Schmitt trigger.

The first input end of the decoding and control unit 101 is electrically connected to the data input end SDI by the third Schmitt trigger 403, where the first input end of the decoding and control unit 101 is electrically connected to an output end of the third Schmitt trigger 403, and the data input end SDI is electrically connected to an input end of the third Schmitt trigger 403. The second input end of the decoding and control unit 101 is electrically connected to the clock input end DCLK by the fourth Schmitt trigger 404, where the second input end of the decoding and control unit 101 is electrically connected to an output end of the fourth Schmitt trigger 404, and the clock input end DCLK is electrically connected to an input end of the fourth Schmitt trigger 404. Here, the Schmitt triggers are configured to regulate signals of input ends of the Schmitt triggers so as to make square wave signals outputted by output ends more stable to thereby improve the reliability of the drive control circuit.

Figures 7, 8:
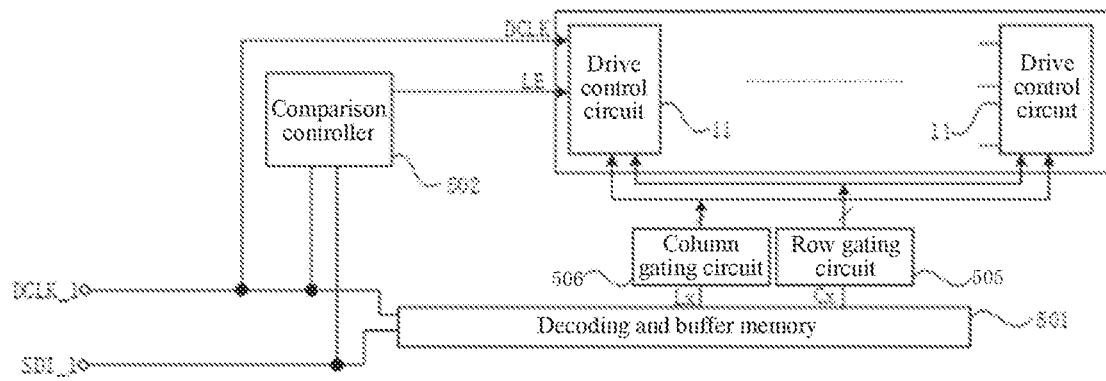
FIG. 7 is a flowchart of a sparse drive method according to an embodiment of the present disclosure.
FIG. 8 is a schematic diagram of a circuit structure of a drive control chip according to an embodiment of the present disclosure.

FIG. 7 is a flowchart of a sparse drive method according to an embodiment of the present disclosure. The sparse drive method is applicable to the drive control circuit according to any one of the foregoing embodiments, where N1 drive signal output ends of the drive control circuit are electrically connected to N1 light-emitting structures in a one-to-one correspondence. Referring to FIG. 7, the sparse drive method includes the following step. In Step 71, the drive control circuit drives, according to preset information, M1 drive signal output ends to output drive signals and to control M1 corresponding light-emitting structures to emit light, where $1 \leq M1 < N1$, and M1 and N1 are both integers. In some embodiments, the quantity N1 of the drive signal output ends of the drive control circuit may be equal to a quantity N+1 of drive sources 103.

For example, the preset information includes position information of two eyes of a person. The drive control circuit is applicable to light-field display technologies. N1 light-emitting structures may all form vector pixels. However, because regions viewed by the two eyes of the person correspond to only M1 light-emitting structures, the drive control circuit only needs to drive the M1 light-emitting structures corresponding to M1 drive signal output ends to send a complete screen to the eyes of the person. When the eyes of the person move, the drive control chip may re-select positions and a quantity of drive signal output ends that need to perform drive output so as to ensure that the person can view the complete screen in real time. Such a drive method is a sparse drive method. With the sparse drive method, only M1 drive signal output ends need to be driven, whereas with a conventional drive method, N1 drive signal output ends need to be driven. Therefore, because M1 is less than N1, and in most cases, N1 is several or even tens of times greater than M1 (e.g., M1 is 4 and N1 is 64), the refresh frame rate of data can be greatly improved by using the sparse drive method at a given bandwidth.

Figure 9:
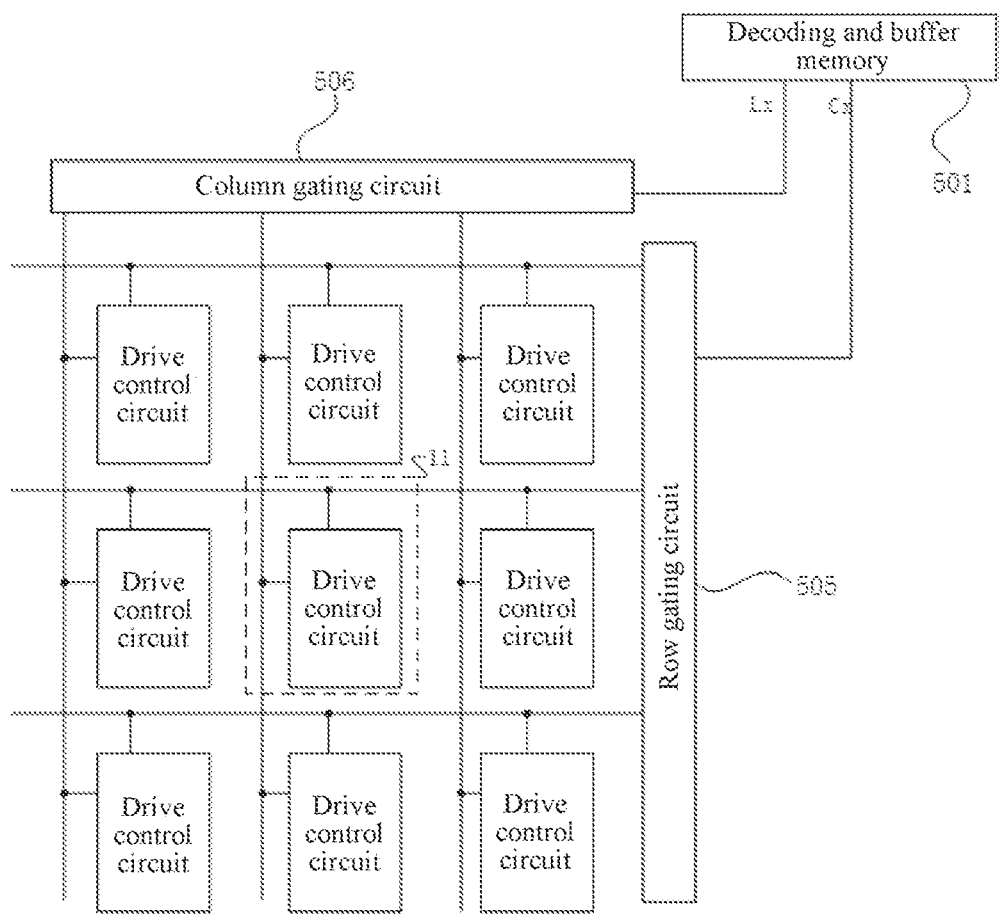
FIG. 9 is a schematic diagram of an arrangement structure of drive control circuits in a drive control chip according to an embodiment of the present disclosure.

FIG. 8 is a schematic diagram of a circuit structure of a drive control chip according to an embodiment of the present disclosure. FIG. 9 is a schematic diagram of an arrangement structure of drive control circuits in a drive control chip according to an embodiment of the present disclosure. Referring to FIG. 8 and FIG. 9, the drive control chip includes at least two cell blocks, a clock terminal DCLK_1, a data terminal SDI_1, at least two drive output ends, a decoding and buffer memory 501, a row gating circuit 505, a column gating circuit 506, and a comparison controller 502, where each cell block includes a drive control circuit 11 The cell blocks are arranged in M2 rows and N2 columns, and M2 and N2 are both positive integers.

A first input end of the decoding and buffer memory 501 is electrically connected to the clock terminal DCLK_1, a second input end of the decoding and buffer memory 501 is electrically connected to the data terminal SDI_1, a first output end Cx of the decoding and buffer memory 501 is electrically connected to an input end of the row gating circuit 505, and a second output end Lx of the decoding and buffer memory 501 is electrically connected to an input end of the column gating circuit 506. M2 output ends of the row gating circuit 505 are correspondingly electrically connected to block selection ends of the M2 columns of drive control circuits 11. N2 output ends of the column gating circuit 506 are correspondingly electrically connected to data input ends of the N2 columns of drive control circuits 11.

The clock terminal DCLK_1 is electrically connected to a clock input end DCLK of the drive control circuit. A first input end of the comparison controller 502 is electrically connected to the clock terminal DCLK_1, a second input end of the comparison controller 502 is electrically connected to the data terminal SDI_1, and an output end of the comparison controller 502 is electrically connected to both or all of control instruction ends LE of at least two drive control circuits. The comparison controller 502 is configured to output a control instruction to the drive control circuits according to an inputted clock signal and an inputted data signal. Second ends of the at least two drive sources are electrically connected to the at least two drive output ends in a one-to-one correspondence.

Data inputted by the data terminal SDI_1 and a clock inputted by the clock terminal DCLK_1 pass through the comparison controller 502 to generate a block start frame latch signal, which is sent to the control instruction ends LE of the drive control circuits 11. The block start frame latch signal is used for latching data as a whole and clearing counters inside the drive control circuits 11. At the same time, the block start frame latch signal is used for writing grayscale data of the buffer memories in the drive control circuits 11 into a comparator, and then clearing the comparator.

Still referring to FIG. 8 and FIG. 9, after decoding inputted data, the decoding and buffer memory 501 obtains a row address and a column address A data signal that needs to be inputted to a cell block can be sent to a column gating circuit together with the column address. When the row gating circuit 505 selects a row under the action of the row address, the column gating circuit 506 receives the column address so that the decoding and buffer memory 501 is electrically connected to a data input end of a drive control circuit 11 corresponding to the column. That is, one column is selected. Therefore, a cell block at which the selected row crosses the selected column is selected. That is, the drive control circuit is selected. The drive control circuit implements a corresponding drive function. An unselected drive control circuit does not implement a corresponding drive function any more, and thereby reduces a bandwidth required for the drive control chip. In most cases, because the drive control chip does not need to drive all the drive output ends for output, the drive control chip can select needed cell blocks instead of selecting all cell blocks. That is, selecting by the drive control chip, cell blocks can also be understood to be using a "sparse" method. In addition, in a cell block, drive signal output ends that need to perform output may further be selected by using a "sparse" method. A "double sparse" drive method further increases a refresh frame rate of data at a given data bandwidth. Moreover, there is no interference between the cell blocks because cell blocks that need to work are selected by using row addresses and column addresses, and the cell blocks are independent of each other all controlled by only the drive control chip. That is, only selected cell blocks work, and unselected cell blocks do not work. At the same time, this does not interfere with the selected cell blocks and thereby improves the stability of the drive control chip.

Figure 10:
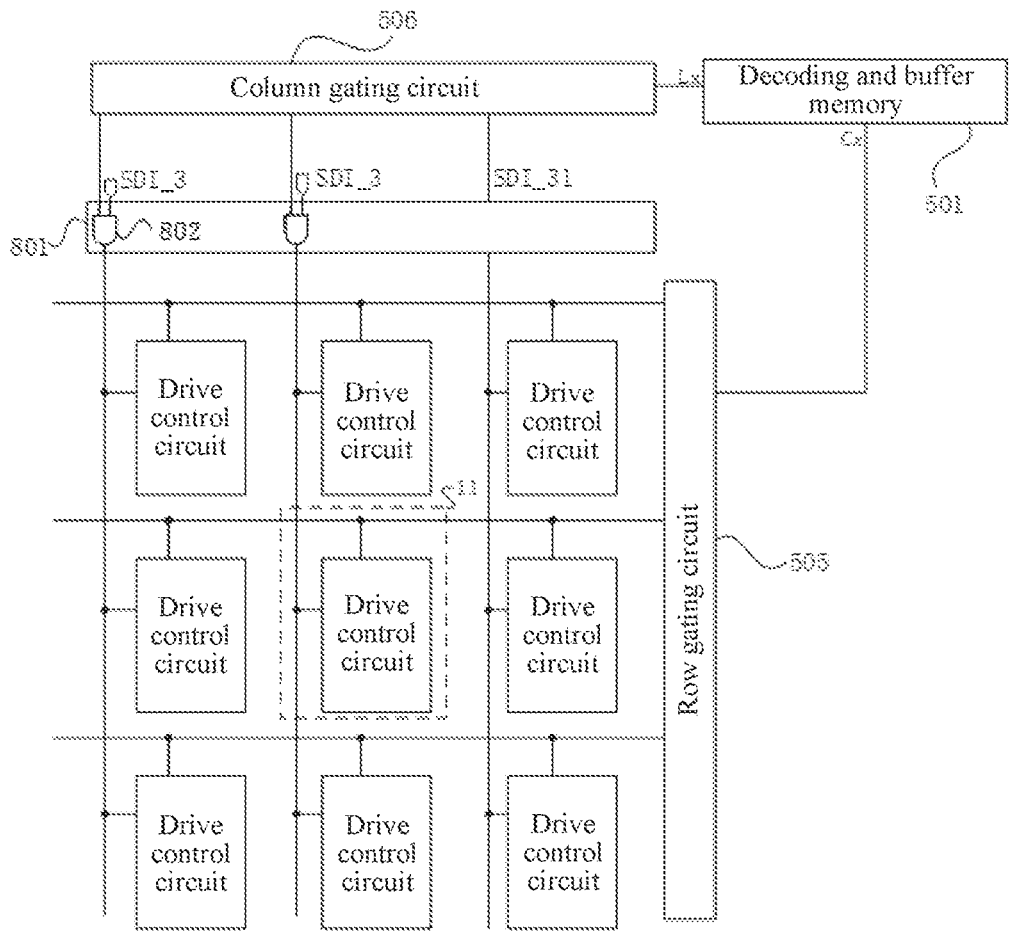
FIG. 10 is a schematic diagram of an arrangement structure of drive control circuits in another drive control chip according to an embodiment of the present disclosure.

FIG. 10 is a schematic diagram of an arrangement structure of drive control circuits in another drive control chip according to an embodiment of the present disclosure. Different from the structure shown in FIG. 9, a serial-parallel drive gating circuit 801 is added to the structure shown in FIG. 10. The drive control chip includes M2, a quantity of rows, times N2, a quantity of columns, and unit blocks. The serial-parallel drive gating circuit 801 includes one first parallel data input end SDI_31, two second parallel data input ends SDI_3, two AND gates 802, two parallel gating ends, and three parallel data output ends. First input ends of the two AND gates 802 are respectively electrically connected to the two second parallel data input ends SDI_3, and second input ends of the two AND gates are respectively electrically connected to the two parallel gating ends. The three output ends of the column gating circuit 506 include one first output end and two second output ends. The first parallel data input end is electrically connected to the first output end of the column gating circuit. The two parallel gating ends are respectively electrically connected to the two second output ends of the column gating circuit 506. The three parallel data output ends correspond to the three columns of cell blocks. The first parallel data input end SDI_31 and the two second parallel data input ends SDI_3 are configured to input parallel data. Output ends of the two AND gates 802 respectively correspond to two parallel data output ends in the three parallel data output ends. Parallel data inputted by the first parallel data input end SDI_31 is outputted by the decoding and buffer memory, and the first parallel data input end SDI_31 and the second input ends of the two AND gates are multiplexed as serial data input ends. In this structure, the drive control chip may select either a serial input mode or a parallel input mode. For example, when the serial input mode is selected, if all the second parallel data input ends SDI_3 are configured to have no input, serial data is decoded by the decoding and buffer memory. The serial data is then outputted to corresponding column cell blocks through the first parallel data input end SDI_31 or the second input ends of the two AND gates 802. When a parallel input mode is selected, the decoding and buffer memory 501 outputs address information and data information of the $0^{th}$ column. The data information of the $0^{th}$ column is outputted to the first parallel data input end SDI_31 of the serial-parallel drive gating circuit 801 through the first output end of the column gating circuit 506. This drives a parallel data output end corresponding to the first parallel data input end SDI_31 to output the data information to a drive control circuit 11 in a corresponding column. All parallel gating ends of the serial-parallel drive gating circuit 801 can be controlled and gated so that data inputted from the gated parallel gating ends can be outputted by parallel data output ends of the serial-parallel drive gating circuit 801 corresponding to the gated parallel gating ends. In a specific implementation, in a parallel mode, because 1 to N2 output ends in second output ends of the column gating circuit are directly connected to 1 to N2 columns of cell blocks, no address signal needs to be inputted. In the parallel mode, the second parallel data input end of the column gating circuit 801 can directly input data information of a corresponding column, and can buffer each row of data of the corresponding column according to the data information of the corresponding column and a row scan signal. In this manner, parallel data inputted by the second parallel data input end SDI_32 of the serial-parallel drive gating circuit 801 is outputted to the drive control circuit 11 of the corresponding column through the corresponding parallel data output end to thereby implement input of the parallel data. For example, a plurality of parallel output interfaces are all connected to each column through a NAND gate. When there is data error, a plurality of outputs exist at the same time. In this case, the NAND gate is not open to ensure that only one column is on, and a plurality of columns cannot be on at the same time. This avoids hardware damage caused by any data error. Here, it may be understood that cell blocks cannot be arranged in 3 rows times 3 columns.

Figure 11:
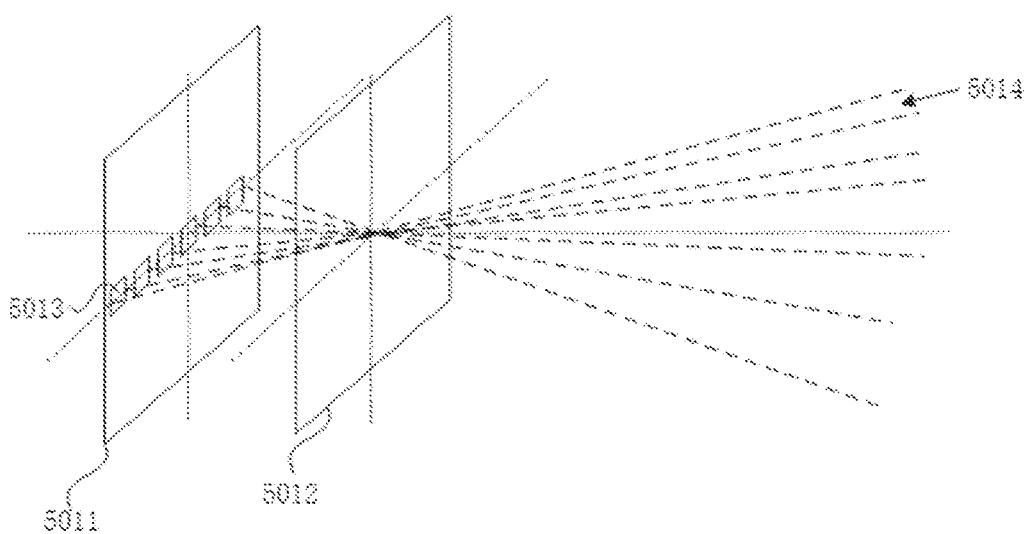
FIG. 11 is a schematic structural diagram of block division of a drive control chip according to an embodiment of the present disclosure.

FIG. 11 is a schematic structural diagram of block division of a drive control chip according to an embodiment of the present disclosure. Referring to FIG. 11, a drive control chip and a micro LED are packaged to form a dense display device 5011. A drive output end of the drive control circuit and the corresponding micro LED are electrically connected to form a display block 5013. For the display block 5013 on the dense display device 5011, light emitted by the display block passes through an optical component 5012 and then forms a very small block viewing region. For example, light emitted by the display block 5013 (each display block corresponds to one cell block) marked in FIG. 11 can be observed in only the marked block viewing region 5014. The display region on the dense display device 5011 is divided into a plurality of display blocks 5013 according to preset rules so that a quantity of viewpoints appearing at the same time in each display block 5013 is extremely small (e.g., 4), and a probability that many viewpoints appear at the same time is very small. Therefore, only a few pixels in the display block 5013 need to be driven instead of driving all pixels. As such, cell blocks that need to be driven can be selected according to needs instead of selecting all cell blocks. This increases the refresh frame rate and reduces the bandwidth.

The preset rules for dividing the display block 5013 are based on a probability distribution of viewpoints in an actual viewing scenario. A block structure is simple (e.g., the display block 5013 includes micro LEDs in m rows and n columns). Block addressing is simple (e.g., the dense display device 5011 includes display blocks 5013 in m1 rows and n1 columns). Conflicts between viewpoints in a block are reduced as much as possible. For a viewpoint conflict with an extremely small probability, some conflicting viewpoints may be selectively abandoned to ensure a best viewing effect. In a specific implementation, division of the display block 5013 can be determined according to display quality requirements on a system display. For example, quality-sensitive content of a region of interest requires that a percentage of good pixels is greater than 95% and a percentage of bad pixels is less than 1%. Quality-insensitive content in a non-region of interest requires that a percentage of good pixels is greater than 80% and a percentage of bad pixels is less than 5%. A basis for division may further include a distribution probability of a pixel spacing corresponding to viewpoints of two eyes of a person, a distribution probability of a viewpoint relationship between neighboring viewers, a distribution probability of relative positions of viewers in an actual viewing scenario, and the like.

In the concept of display quality, a normally displayed pixel may be referred to as a "good pixel," and a pixel that cannot be normally displayed may be referred to as a "bad pixel" (i.e., a pixel of which display is abandoned when there is a conflict of viewpoints). A pixel that cannot be displayed in high quality may be referred to as a "weak pixel" (e.g., in a same display block, the pixels may be referred to as "weak pixels" if requirements for brightness gains of viewpoints are inconsistent, the gain setting is based on one viewpoint, and display brightness of other viewpoints is distorted).

The dense display device 5011 can be divided into a "region of interest" and a "non-region of interest." If content displayed in a region requires a viewer to pay attention, the region is a "region of interest." If content displayed in a region does not require a viewer to pay attention, the region is a "non-region of interest." The displayed content may be divided into "quality-sensitive content" and "quality-insensitive content." The "quality-sensitive content" means that the displayed content has a relatively large contrast, and when there is an error in the displayed content, a viewer can easily observe the error. The "quality-insensitive content" means that the display content has a relatively small contrast.

For example, the dense display device 5011 may include a 224*224 micro LED array. According to the foregoing division rules, the display block 5013 can be configured to include 14*8 micro LEDs, and each drive control circuit includes 14*8 drive signal output ends. In the display block 5013, there are 4 viewpoints at most. That is, when addressing drive is performed in the block, only 4 pixels in 14*8 pixels need to be driven. Such a drive method may be understood as "selective static sparse drive."

According to some embodiments, a drive control chip including a drive control circuit, a clock terminal, a data terminal, at least two drive output ends, a decoding and buffer memory, and a comparison controller is adopted. The drive control chip may be used to implement a drive method of selective static sparse drive, in which only a few pixels in a needed display block need to be driven to thereby greatly reduces the bandwidth required for the drive. In addition, because data of a data terminal can be decoded in the drive control circuit, and then sent directly to a pixel that needs to be driven, a high refresh frame rate is achieved.

Referring to FIG. 6 to FIG. 12, after light emitted by pixels in different display blocks 5013 passes through an optical component 5012, brightness of outgoing light rays may be different, resulting in different image brightness at different viewpoints. To ensure the consistency of display brightness, a block current regulation unit 301 included in the drive control circuit is used to compensate for brightness. Data inputted by the data terminal SDI_1 may include a current gain segment corresponding to the drive control circuit 11. The decoding and control unit 101 transmits the data of the current gain segment to the state buffer 302. An adjustable current-limiting resistor is connected to a block current regulation end R, and a resistance of the current-limiting resistor connected to the block current regulation end R is adjusted by using the current gain segment so that a current outputted by the drive output end of the drive control circuit 11 can be compensated for. This allows a more even display effect.

Figure 12:
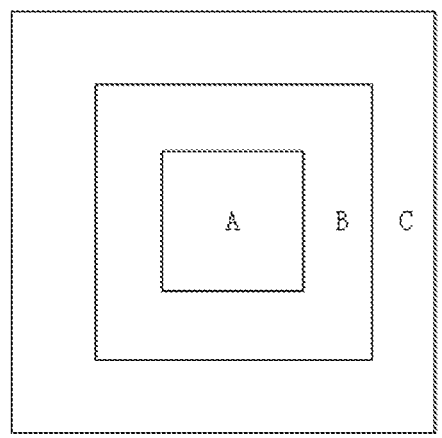
FIG. 12 is a schematic structural diagram of a brightness attenuation region according to an embodiment of the present disclosure.

FIG. 12 is a schematic structural diagram of a brightness attenuation region according to an embodiment of the present disclosure. Referring to FIG. 11 and FIG. 12, different regions such as a first region A, a second region B, and a third region C on the dense display device 5011 have different brightness attenuation after passing through the optical component 5012. Different current compensation can be performed on display blocks 5013 in different regions. The resistances of current limiting resistors that are of the drive control circuits in the different display blocks 5013 and that are connected to the block current regulation end R can be controlled to optimize the display brightness at different viewpoints to achieve even brightness. Performing current compensation by using the display block 5013 as a unit not only can save circuit resources, but also can reduce an amount of data transmission and save a transmission bandwidth.

For example, in light-field display technologies, a plane mirror may be used to reflect light rays of the dense display device to implement the function of increasing the display format. Due to an increase of an optical path and a reflection loss of the mirror, light intensity of the reflected part is reduced and brightness compensation can be implemented by adjusting the current gain of the corresponding drive control circuit. As an example, when there is a requirement for local highlight display, targeted highlight can be implemented on a target viewpoint by adjusting the current gain of the drive control circuit so as to achieve display of a more realistic high dynamic range (HDR) image.

For example, in the drive control chip, the current gain is adjusted by using the drive control circuit as a unit to implement the function of changing resolution. The function of changing resolution refers to changing, according to a change of a viewing distance, a quantity of pixel arrays actually driven by a piece of display data. The function of changing resolution can further increase the depth of field during far-field viewing. During application of the function of changing resolution, actually lightened pixels change and display brightness also changes. In this case, the brightness needs to be adjusted by using the current gain function of the drive control circuit. At a small probability, when there are two fields (near-field and far-field) with viewpoint distributions at the same time in the drive control circuit, the brightness gain is adjusted preferentially according to the near-field viewpoint. For example, a light spot of outgoing light of a pixel in a dense display device increases as a distance increases When a size of the light spot exceeds resolution, the light spot may cause a loss of focus and reduce a depth of field. During long-distance viewing, reducing a quantity of pixels driven can reduce the light spot and ensure that focusing can be achieved within a larger depth of field range so that a larger depth of field can be obtained. In addition, the function of changing resolution includes a far-field display mode and a near-field display mode. In the far-field display mode, one display pixel can be achieved by driving one micro LED. In the near-field display mode, one display pixel can be achieved by driving four micro LEDs (micro LEDs not corresponding to a same drive control circuit). In this case, the current gains of different drive control circuits are adjusted to make total brightness of the four micro LEDs consistent with brightness of one micro LED in the far-field display mode to ensure the evenness of brightness.

For example, in the drive control chip, the current gain is adjusted by using the drive control circuit as a unit to alleviate the brightness drop caused by long-term operation of the dense display device. Adjustment is supported in a case of inconsistent initial brightness. During long-term operation of the dense display device, the brightness drop caused by problems, such as heat dissipation, may seriously affect a viewing effect. The current gain of the drive control circuit may be set to a value greater than 1 according to a degree of the brightness drop of the display device and thereby improve display brightness and prolonging service life. In addition, when the dense display device is in a darker or brighter environment, the current gain is respectively adjusted to be greater than 1 or less than 1 to achieve the best viewing effect. A coefficient of the foregoing current gain may change in multiple steps (e.g., there may be up to dozens of gain coefficients) and the gain may alternatively be a non-linear gain.

Figure 13:
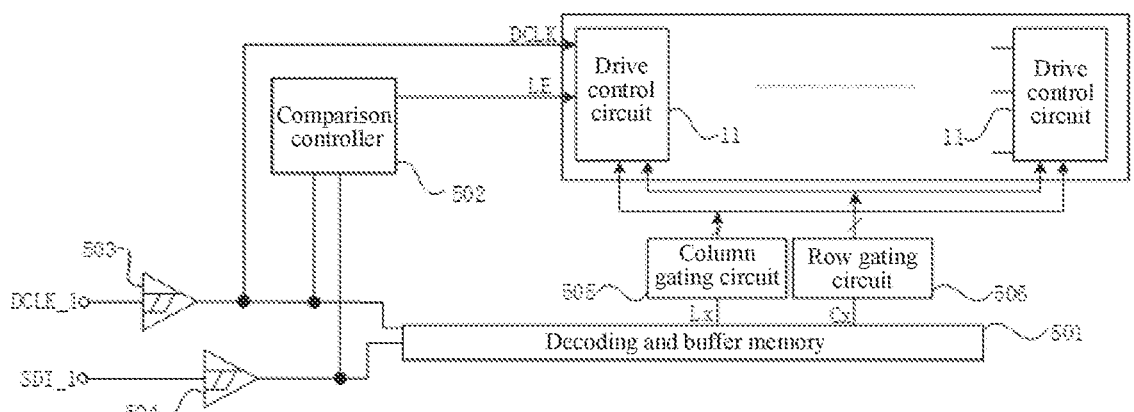
FIG. 13 is a schematic diagram of a circuit structure of another drive control chip according to an embodiment of the present disclosure.

FIG. 13 is a schematic diagram of a circuit structure of another drive control chip according to an embodiment of the present disclosure. Referring to FIG. 13, the drive control chip further includes a fifth Schmitt trigger 503 and a sixth Schmitt trigger 504. The first input end of the decoding and buffer memory 501 is electrically connected to the clock terminal DCLK_1 by the fifth Schmitt trigger 503, where the first input end of the decoding and buffer memory 501 is electrically connected to an output end of the fifth Schmitt trigger 503. The clock terminal DCLK_1 is electrically connected to an input end of the fifth Schmitt trigger 503. The second input end of the decoding and buffer memory 501 is electrically connected to the data terminal SDI_1 by the sixth Schmitt trigger 504, where the second input end of the decoding and buffer memory 501 is electrically connected to an output end of the sixth Schmitt trigger 504, and the data terminal SDI_1 is electrically connected to an input end of the sixth Schmitt trigger 504. The fifth Schmitt trigger 503 and the sixth Schmitt trigger 504 are disposed to make square wave signals inputted by the first input end and the second input end of the decoding and buffer memory 501 more regularly to improve stability and reliability of the drive control chip.

Figure 14:
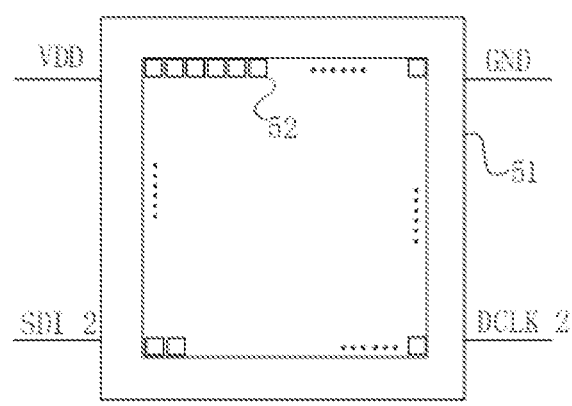
FIG. 14 is a schematic structural diagram of an integrated packaged device according to an embodiment of the present disclosure.

FIG. 14 is a schematic structural diagram of an integrated packaged device according to an embodiment of the present discloser. The integrated packaged device includes a drive control chip 51, an integrated data input end SDI_2, an integrated clock input end DCLK_2, a power supply terminal VDD, a ground terminal GND, and a dense display device 52. The integrated data input end SDI_2 is electrically connected to the data terminals of the at least two drive control chips. The integrated clock input end DCLK_2 is electrically connected to the clock terminals of the at least two drive control chips. The power supply terminal is configured to provide electric energy for the integrated packaged device and the ground terminal is configured for grounding.

The dense display device includes at least two light-emitting units. The drive output ends of the drive control chip are electrically connected to the light-emitting units in a one-to-one correspondence. The drive control chip is configured to drive, through the drive output end, a corresponding light-emitting unit to emit light.

In some embodiments, the light-emitting unit 52 may be a micro LED. The drive control chip 51 and at least two light-emitting units 52 are packaged to obtain an integrated packaged device, which greatly reduces any difficulty in management and wiring. External pins of the drive control chip (e.g., the integrated data input end SDI_2, the integrated clock input end DCLK_2, and the power supply terminal VDD) can be connected to the output of the controller to implement data communication between the control system and the integrated packaged device. For example, the light-emitting unit 52 is micron-level micro LEDs arranged in an array (e.g., an array of 256*256 15-micron micro LEDs), where a micro LED lamp may be in any one of red, green, and blue. The integrated data input end SDI_2 can be configured to input serial data, and the ground terminal GND can be configured to control logic and grounding of a drive current of a drive source.

The dense display device may be a micro LED chip. At present, packaging technologies for the micro LED and the drive chip mainly include chip-level soldering, epitaxial wafer-level soldering, and film transfer. The chip-level soldering refers to directly cutting an LED into micron-level LED chips, and then key-jointing the micron-level chips to a display substrate one by one by using SMT or COB technologies.

The epitaxial wafer-level soldering refers to directly forming a micron-level micro LED-LED epitaxial film structure on an epitaxial film layer of an LED by using the inductively coupled plasma etching technology, directly key-jointing the LED wafer (including the epitaxial film layer and a substrate) to a drive circuit substrate, and peeling off the substrate by using a physical or chemical mechanism. This only reserves the micro LED epitaxial film structure to form a display pixel on the drive circuit substrate.

The film transfer refers to peeling off an LED substrate, using a temporary substrate to carry an LED epitaxial film layer, and then forming a micron-level micro LED epitaxial film structure by using inductively coupled plasma etching. Alternatively, the film transfer refers to first forming a micron-level micro LED epitaxial film structure by using inductively coupled plasma etching, peeling off the LED substrate, and then using a temporary substrate to carry the LED epitaxial film structure.

The chip-level transfer technology can meet requirements for preparing a display screen of any size, but has the disadvantages of a small quantity in one-time transfer and insufficient efficiency of the overall process. The epitaxial wafer transfer is similar to film transfer technology. However, the epitaxial wafer transfer differs from film transfer technology in that a final pixel pitch is determined during production of an LED epitaxial wafer resulting in some limitations. Further, a final display pixel pitch is not necessarily equal to a spacing formed during preparation of LED lamp beads, but an additional temporary bearing substrate needs to be used which results in a more complex procedure. Nonetheless, from the perspective of application, film transfer technology has more advantages.

Film transfer technology is achieved by different companies using different means. For example, LuxVue achieves the transfer of a chip at 1 to 100 μm in an electrostatic adsorption manner. As an example, X-Celeprint uses Micro-Transfer-Printing (μTP) technology to transfer micro LEDs to a flexible substrate or a glass substrate so that a large quantity of micro LEDs can be transferred at one time. The massive transfer (e.g., laser transfer technology) of Uniqarta can achieve transfer of 14 million LEDs per hour, while conventional "pick and place" techniques can transfer only 10,000 to 25,000 LEDs per hour. The BAR technology of QMAT also uses laser transfer and can implement large-scale transfer quickly.

In the present disclosure, the package design of a micro LED drive chip is compatible with the epitaxial soldering and transfer of micro LEDs and film transfer. The micro LED drive chip can be directly integrated with a bare chip of the micro LED to reduce processing difficulties. A data format of a signal inputted by the integrated data input end includes a frame synchronization bit, a drive circuit count bit, M3 drive circuit address bits, M3 start bits, M3 current gain bits, M3 intra-block viewpoint count bits, M3×N3 intra-drive control circuit address bits, and M3×N3 grayscale data bits. M3 is an integer ranging from 1 to 64, and N3 is an integer ranging from 1 to 4.

The frame synchronization bit may include a pre-frame synchronization bit and a post-frame synchronization bit. The pre-frame synchronization bit and the post-frame synchronization bit can respectively control initial synchronization and latching of data. The drive circuit count bit indicates a quantity of drive control circuits that the frame of data needs to drive. The intra-block viewpoint count bit indicates a quantity of viewpoints included in a drive control circuit. M3 represents a total quantity of drive control circuits included in the frame of data, and N3 represents a quantity of viewpoints inside the drive control circuit. The current gain bit represents the current gain internally needed by the drive control circuit. The intra-drive control circuit address bit is an address of a viewpoint inside the drive control circuit. The start bit can be used as a signal for starting the drive circuit, thereby reducing a probability of incorrectly starting the drive circuit.

The frame synchronization bit can be multi-bit which reduces the probability that the frame synchronization bit has data consistent with that of bits of a signal inputted by the integrated data input end other than the frame synchronization bit. For example, the frame synchronization bit may selectively be 36 bits, 48 bits, or 56 bits. In some embodiments, the frame synchronization bit is 56 bits. By setting the frame synchronization bit to 56 bits, the probability that the frame synchronization bit has data consistent with that of bits of a signal inputted by the integrated data input end other than the frame synchronization bit can be greatly reduced. If an error having a small probability is allowed in a display scenario, the frame synchronization bit can be directly applied and an error probability thereof is about 1 time/year. If other data is the same as data of the frame synchronization bit, it can be set so that the frame data is not displayed to adapt to a stricter display scenario. It should be noted that selection of a quantity of bits of the frame synchronization bit can be adjusted according to requirements. If requirements of a display scenario are stricter, a frame synchronization bit with more bits can be selected.

A quantity of bits of a frame of data is not a fixed value. An amount of data is determined by a length of the grayscale data bit and a quantity and a distribution state of viewpoints. For example, a maximum amount of data of a frame of data may not exceed 2048 bits, and a data format may be: frame synchronization bit (16 bits)+drive circuit count bit (6 bits)+M3*[drive circuit address bit (10 bits)+start bit (2 bits)+current gain bit (6 bits)+intra-block viewpoint count bit (2 bits)+N3*(intra-drive circuit address bit (6 bits)+grayscale data bit (11 bit))]. When M3=54, and N3=1, a total quantity of viewpoints supported by the drive control chip is the least 54. A maximum amount of data of a frame of data is 2048 bits. When the clock frequency is 80 MHz, the data frame rate can reach 39.06 kfps. When the clock frequency is 200 MHz, a data frame rate may reach 97.6 kfps, and a display frame rate is extremely high. In addition, a strong data compression capability is possessed even if the grayscale data bit is not increased and a loading capability can be improved.

For example, the intra-drive control circuit address bit occupies 6 bits. A 1-bit address state bit can be added and is used for indicating whether an intra-block address in a state buffer changes. When a position of a viewpoint does not change, a 6-bit address code can be omitted. When the position of the viewpoint changes, a 1-bit address state code and a new 6-bit address code are transmitted at the same time. In this mode, 1-bit data is added to omit 6-bit data in most cases This greatly reduces a total amount of data in a frame so that a maximum quantity of viewpoints can be increased.

For example, the current gain bit occupies 6 bits. A 1-bit current gain state bit is added and can be used for indicating whether the current gain in the state buffer changes. When the current gain does not change, 6-bit data can be reduced. In most cases, 6-bit data can be omitted to further reduce a total amount of data in one frame and thereby increases the maximum quantity of viewpoints.

Figure 15:
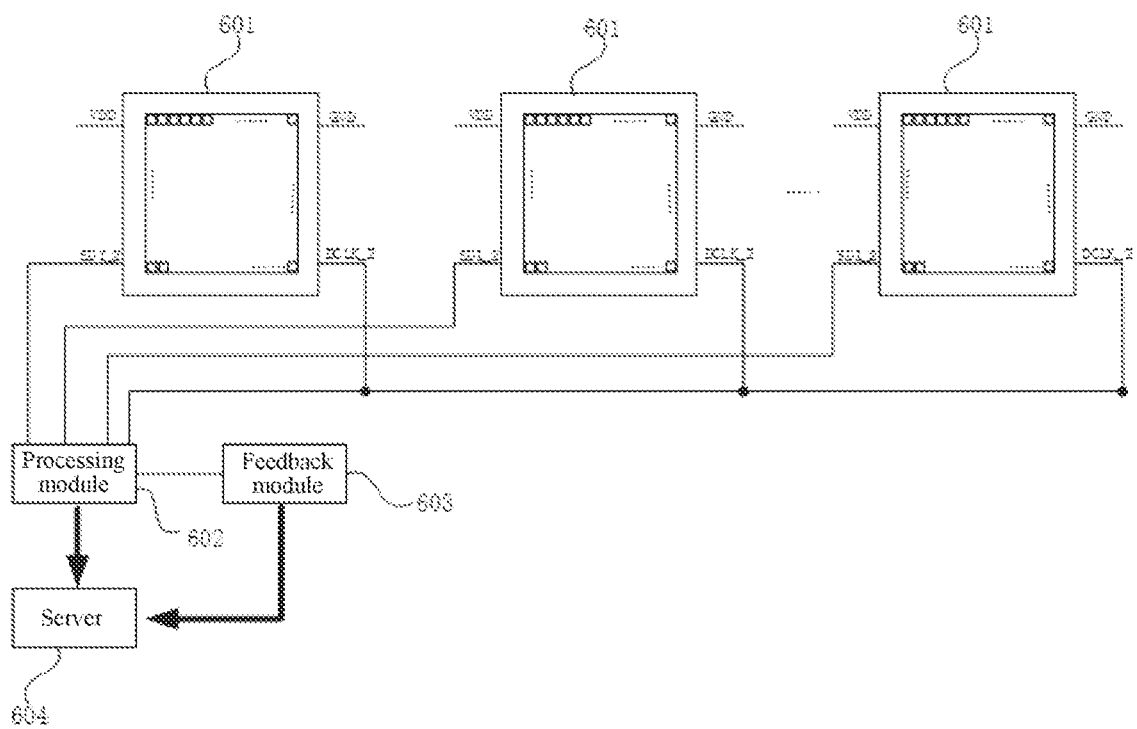
FIG. 15 is a schematic structural diagram of a display system according to an embodiment of the present disclosure.

FIG. 15 is a schematic structural diagram of a display system according to an embodiment of the present disclosure. Referring to FIG. 15, the display system includes at least two integrated packaged devices 601, a feedback module 603 and a processing module 602. The processing module 602 is electrically connected to integrated data input ends SDI_2 and integrated clock input ends DCLK_2 of the at least two integrated packaged devices 601. The processing module 602 is also electrically connected to the feedback module 603. The processing module 602 may include an ARM and an FPGA. The processing module 602 is configured to receive preset information sent by a server 604, and parse, according to feedback information from the feedback module 603, the preset information. The processing module 602 then sends the preset information to the integrated packaged device 601 to drive the integrated packaged device 601 for display. The feedback module 603 is configured to track position information of an eye, and feed back the position information of the eye to the processing module 602.

For example, the server 604 includes a video file. The video file in the server 604 is sent to the processing module 602. The processing module 602 encodes the video file to form a data format required for the work of the integrated packaged device 601. The integrated packaged device 601 parses the data to obtain information such as a quantity of and addresses of drive control units that the integrated packaged device 601 needs to drive internally, a quantity of viewpoints, the current gain, and viewpoint addresses inside the drive control units. The integrated packaged device 601 then drives corresponding micro LEDs to emit light by using the sparse drive method and implement the display function. The feedback module 603 may be configured to track information of eyes of a person, feed back the information of the eyes of the person to the processing module 602, and feed back the information of the eyes of the person to the server 604. The processing module 604 adjusts display regions according to the feedback information. For example, when the eyes of the person move, an effect of synchronizing display with positions of the eyes of the person can be achieved by adjusting the display regions.

Figure 16:
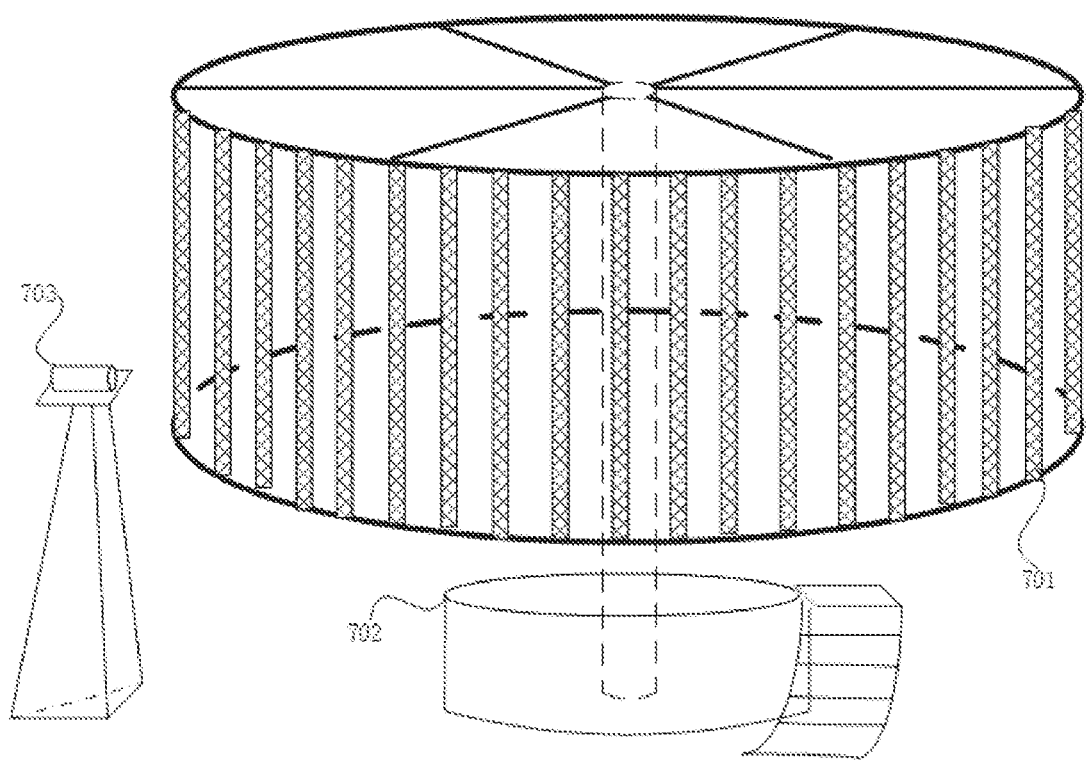
FIG. 16 is a schematic structural diagram of a rotatable display system according to an embodiment of the present disclosure.

FIG. 16 is a schematic structural diagram of a rotatable display system according to an embodiment of the present disclosure. Referring to FIG. 16, the rotatable display system includes a viewing platform 702, at least two lamp panels 701, and a laser feedback unit 703. In correspondence to the display system shown in FIG. 15, each lamp panel 701 includes at least one integrated packaged device 601. The at least two lamp panels 701 are located on a mechanical rotating platform viewed by a viewer on the viewing platform 702. The mechanical rotating platform rotates to drive the lamp panel 701 to rotate. Based on the visual persistence effect, the viewer can view a complete image. The feedback module 603 and the processing module 602 are configured to control display content on the integrated packaged device 601. The sparse drive method is used to respectively drive pixels corresponding to the left and right eyes of the viewer. Light rays emitted from the pixels respectively reach the left and right eyes along different emitting directions to form a binocular parallax and achieve a 3D display effect. When the viewer moves, the feedback module 603 provides feedback to the processing module 602. The integrated packaged device updates positions of display pixels and display content. When the viewer moves continuously, the viewer can see a continuously changing image with a binocular parallax so that a realistic 3D display effect can be formed. The laser feedback unit 703 can feed back information such as a rotation speed of the mechanical rotating system. This avoids the mechanical rotating system being faulty and displaying incorrect content.

What is claimed is:

1. A drive control circuit, comprising:
   a decoding and control unit comprising a first input terminal and a second input terminal, the first input terminal being electrically connected to a data input, and the second input terminal being electrically connected to a clock input, the decoding and control unit configured to generate an address signal and a control signal based at least in part upon the data input and the clock input;
   a plurality of decoding and gating units electrically coupled to the decoding and control unit and configured to receive the address signal and the control signal, the plurality of decoding and gating units are configured to decode the address signal to generate a decoding result, at least a part of the plurality of decoding and gating units being selected based upon the address signal and the control signal, each decoding and gating unit of the at least a part of the plurality of decoding and gating units configured to generate a output signal based upon the address signal and the control signal; and a plurality of drive sources coupled to the plurality of decoding and gating units, each drive source of at least a part of the plurality of drive sources configured to receive the output signal of a respective decoding and gating units and generate a drive signal based upon the output signal.

2. The drive control circuit of claim 1, wherein each decoding and gating unit of the plurality of decoding and gating units comprises a decoding buffer memory and a first switch.

3. The drive control circuit of claim 2, further comprising a control instruction terminal, a counter, and a synchronization controller;
wherein:
each decoding and gating unit of the plurality of decoding and gating unit further comprises a comparator;
the comparator is coupled to the decoding buffer memory and a second switch, the second switch being different from the first switch;
the synchronization controller is coupled to the counter and the control instruction terminal; and
the counter is coupled to the comparator of a respective decoding and gating unit of the plurality of decoding and gating units.

4. The drive control circuit of claim 3, further comprising a block selection terminal, a block current regulation unit, a block current regulation terminal, and a state buffer;
wherein:
a first input terminal of the block current regulation unit is electrically connected to the block current regulation terminal, and a second input terminal of the block current regulation unit is electrically connected to a first output terminal of the state buffer;
an output terminal of the block current regulation unit is electrically connected to the plurality of drive sources;
an input terminal of the state buffer is electrically connected to a second output terminal of the synchronization controller;
a second output terminal of the state buffer is electrically coupled to the decoding and control unit; and
a second input terminal of the synchronization controller is electrically connected to the block selection terminal.

5. The drive control circuit of claim 4, further comprising a first Schmitt trigger, a second Schmitt trigger, a third Schmitt trigger, and a fourth Schmitt trigger;
wherein:
the first Schmitt trigger is coupled to the counter and the clock input;
the second Schmitt trigger is coupled to the synchronization controller and the control instruction terminal;
the third Schmitt trigger is coupled to the decoding and control unit and the data input; and
the fourth Schmitt trigger is coupled to the decoding and control unit and the clock input.

6. The drive control circuit of claim 1, wherein the drive control circuit is configured to drive N light emission structures, wherein the plurality of driving sources are configured to generate M driving signals, wherein $1 \leq M < N$.

7. A sparse drive method for a drive control circuit having N1 drive signal output terminals electrically connected to N1 light-emitting structures in a one-to-one correspondence, the sparse drive method comprising:

generating, by the drive control circuit, an address signal and a control signal based at least in part upon a data input and a clock input;
generating, by the drive control circuit, based upon the address signal and the control signal, M1 drive signals; and
driving, by the drive control circuit, the M1 drive signals at M1 corresponding drive signal output terminals to control M1 corresponding light-emitting structures to emit light;
wherein $1 \leq M1 < N1$, and M1 and N1 are integers;
wherein the M1 drive signals are generated based at least in part upon preset information, wherein the preset information includes position information associated with two eyes of a person.

8. A drive control chip, comprising:
a clock terminal configured to receive a clock input,
a data terminal configured to receive a data input,
a plurality of cell blocks arranged in M2 rows and N2 columns, each cell block of the plurality of cell block including a drive control circuit, wherein M2 and N2 are integers;
a row gating circuit having M2 output terminals electrically connected to block selection terminals of the plurality of cell blocks;
a column gating circuit having N2 output terminals electrically connected to data input terminals of the plurality of cell blocks;
a decoding and buffer memory having a first input terminal electrically connected to the clock terminal, a second input terminal electrically connected to the data terminal, a first output terminal electrically connected to an input terminal of the row gating circuit, a second output terminal electrically connected to an input terminal of the column gating circuit; and
a comparison controller having a first input terminal electrically connected to the clock terminal, a second input terminal electrically connected to the data terminal, an output terminal electrically connected to a control instruction terminal of the drive control circuit in each cell block of the plurality of cell blocks;
wherein:
the clock terminal is electrically connected to a clock input terminal of the drive control circuit in the each cell block of the plurality of cell blocks; and
the comparison controller is configured to output a control instruction to the drive control circuit in each cell block of the plurality of cell blocks based upon the clock input and the data input.

9. The drive control chip of claim 8, further comprising a serial-parallel drive gating circuit having a first parallel data input terminal, N2−1 second parallel data input terminals, N2−1 AND gates, N2−1 parallel gating terminals, and N2 parallel data output terminals;
wherein:
the N2 output terminals of the column gating circuit include a first output terminal and N2−1 second output terminals;
first input terminals of the N2−1 AND gates are electrically connected to the N2−1 second parallel data input terminals;
second input terminals of the N2−1 AND gates are electrically connected to the N2−1 parallel gating terminals;
the first parallel data input terminal is electrically connected to the first output terminal of the column gating circuit;

the N2−1 parallel gating ends are electrically connected to the N2−1 second output terminals of the column gating circuit, the N2 parallel data output terminals corresponding to the N2 columns of the plurality of cell blocks;

the first parallel data input terminal and the N2−1 second parallel data input terminals are configured to receive parallel data; and the first parallel data input terminal and the second input terminals of the N2−1 AND gates are multiplexed as serial data input terminals, wherein M2 and N2 are greater than or equal to 2.

10. The drive control chip of claim 8, further comprising a first Schmitt trigger and a second Schmitt trigger, wherein:

the first input terminal of the decoding and buffer memory is electrically connected to the clock terminal by the first Schmitt trigger, the first input terminal being electrically connected to an output terminal of the first Schmitt trigger and the clock terminal being electrically connected to an input terminal of the first Schmitt trigger; and the second input terminal of the decoding and buffer memory is electrically connected to the data terminal by the second Schmitt trigger, the second input terminal being electrically connected to an output terminal of the second Schmitt trigger and the data terminal being electrically connected to an input terminal of the second Schmitt trigger.

11. The drive control chip of claim 8, wherein the drive control chip is disposed in an integrated packaged device.

12. The drive control chip of claim 11, wherein the integrated packaged device comprises:

an integrated data input terminal electrically connected to the data terminal of the drive control chip;

an integrated clock input terminal electrically connected to the clock terminal of the drive control chip;

a power supply terminal configured to provide electric energy for the integrated packaged device;

a ground terminal configured to connect to a ground; and a dense display device having a plurality of light-emitting units, wherein the drive control chip further comprises drive control output terminals electrically connected to the light-emitting units in a one-to-one correspondence.

13. The drive control chip of claim 12, wherein a data format of a signal inputted by the integrated data input terminal includes a frame synchronization bit, a drive circuit count bit, M3 drive circuit address bits, M3 start bits, M3 current gain bits, M3 intra-block viewpoint count bits, M3×N3 intra-drive control circuit address bits, and M3×N3 grayscale data bits, wherein M3 is an integer ranging from 1 to 64, and N3 is an integer ranging from 1 to 4.

14. The drive control chip of claim 12, wherein the light-emitting unit includes a micro LED.

15. A display system comprising:

a drive control chip comprising:

a clock terminal configured to receive a clock input, a data terminal configured to receive a data input, a plurality of cell blocks arranged in M2 rows and N2 columns, each cell block of the plurality of cell block including a drive control circuit, wherein M2 and N2 are integers;

a row gating circuit having M2 output terminals electrically connected to block selection terminals of the plurality of cell blocks;

a column gating circuit having N2 output terminals electrically connected to data input terminals of the plurality of cell blocks;

a decoding and buffer memory having a first input terminal electrically connected to the clock terminal, a second input terminal electrically connected to the data terminal, a first output terminal electrically connected to an input terminal of the row gating circuit, a second output terminal electrically connected to an input terminal of the column gating circuit; and a comparison controller having a first input terminal electrically connected to the clock terminal, a second input terminal electrically connected to the data terminal, an output terminal electrically connected to a control instruction terminal of the drive control circuit in each cell block of the plurality of cell blocks;

a processing module electrically coupled to the driver control chip; and a feedback module electrically connected to the processing module;

wherein the feedback module is configured to track position information of an eye and send the position information of the eye to the processing module; and wherein the processing module is configured to:

receive preset information;

parse the preset information based upon feedback information from the feedback module; and send the preset information to the drive control chip.

* * * * *